United States Patent [19]

Iwamura

[11] Patent Number: 5,742,620
[45] Date of Patent: Apr. 21, 1998

[54] GMD DECODING APPARATUS AND A METHOD THEREFOR

[75] Inventor: Keiichi Iwamura, Yokohama, Japan

[73] Assignee: Canon Kabushiki Kaisha, Tokyo, Japan

[21] Appl. No.: 684,080

[22] Filed: Jul. 19, 1996

[30] Foreign Application Priority Data

Jul. 21, 1995 [JP] Japan .................................. 7-185448

[51] Int. Cl.$^6$ ............................................. H03M 13/00
[52] U.S. Cl. ............................. 371/37.11; 371/37.06
[58] Field of Search ......................... 371/37.06, 37.11

[56] References Cited

U.S. PATENT DOCUMENTS

| | | | |
|---|---|---|---|
| 4,633,470 | 12/1986 | Welch et al. | 371/37 |
| 4,821,268 | 4/1989 | Berlekamp | 371/37.11 |
| 4,868,828 | 9/1989 | Shao et al. | 371/5.1 |
| 5,452,310 | 9/1995 | Arts | 371/37.07 |
| 5,535,140 | 7/1996 | Iwamura | 364/550 |
| 5,541,937 | 7/1996 | Iwamura | 371/37.12 |

*Primary Examiner*—Stephen M. Baker
*Attorney, Agent, or Firm*—Fitzpatrick, Cella, Harper & Scinto

[57] ABSTRACT

A decoding apparatus generates code words by means of syndrome polynomial, erasure location polynomial, and polynomials indicating error location and size thereof in order to materialize a high speed decoding with a smaller size of memory and a smaller amount of calculations. This decoding apparatus comprises an error location polynomial $P_k(x)$ using the product of the syndrome polynomial and the erasure location polynomial as an initial value; a memory unit to store the polynomial $Q_k(x)$ to obtain an error number and auxiliary polynomials $U_k(x)$ and $W_k(x)$; a calculation unit to execute a given plurality of calculations with a plurality of polynomials stored in the memory unit as input in order to output a plurality of polynomials, and a control unit to update the polynomials stored in the memory unit by the output of the calculating unit, and to decide on the input and output relations of the calculation unit in accordance with the d–2th coefficients $d_k$ and $b_k$ of the polynomials $Q_k(x)$ and $W_k(x)$.

8 Claims, 9 Drawing Sheets

GMD DECODING APPARATUS AND A METHOD THEREFOR

BACKGROUND OF THE INVENTION

1. Field of the Invention

The present invention relates to a decoding apparatus and a method therefor that use error correcting codes on the reception side in order to correct errors generated in the communication path or memory medium of the digital communication system and digital memory system. More particularly, the invention relates to a decoding apparatus and a method therefor that use the information of communication path for transmission code words to approximately perform a maximum likelihood decoding.

2. Related Background Art

The decoding method of error correction codes is classified into a hard decision decoding and a soft decision decoding. The hard decision decoding is a method for correcting errors in the digital system that decides on reception signals by "0" or "1". Since the structure of the decoding apparatus can be made simple, this method is widely adopted for use of a CD (Compact Disk) and many others.

On the other hand, the soft decision decoding is to acquire the analogue weights that indicate reliability of decisions in addition to the digital system that makes decisions on the reception signals by "0" or "1", and to utilize such weights for correction of errors in accordance with situations. Therefore, although the decoding process of this method is complicated, it is possible to bring a sufficient capability of error correction codes, and to enhance the SN ratio by 2 to 3 dB as compared with the hard decision decoding.

The GMD (Generalized Minimum Distance) decoding method given below is one of the soft decision decoding methods. This is known as a decoding method capable of approximately performing the minimum likelihood decoding by use of the analogue weights thereof.

[GMD Decoding Method]

With respect to each of the symbols of reception system R of a code length $n=(R_0, R_1, \ldots, R_{n-1})$, the analogue weights that indicate reliability are defined as $\theta=(\theta_0, \theta_1, \ldots, \theta_{n-1})$. However, provided that $0 \leq \theta_i \leq 1$, it is assumed that the symbol $R_i$ of the reception system R is more reliable than the symbol $R_j$ if the $\theta_i > \theta_j$.

Also, the function $X(a, b)$ is defined as $$x(a, b)=1 \text{ if } a=b$$
$$x(a, b)=-1 \text{ if } a \neq b \quad (1)$$

and then, the inner product of R·C of the reception system $R=(R_0, R_1, \ldots, R_{n-1})$ and the code word $C=(c_0, c_1, \ldots, c_{n-1})$ is defined as follows:

$$R \cdot C = \sum_{i=0}^{n-1} \theta_i \cdot \chi(R_i, c_i) \quad (2)$$

Here, given the minimum distance as d, the reception system R that satisfies the inequality (3) given below can be corrected: this is established by G. D. Forney, Jr in the "Concatenated Codes", MIT Research Monograph No. 37, MIT Press (1966), and R. E. Blahut in the "Theory and Practice of Error Control Codes", Addison-Wesley Publishing Company, Inc. (1983).

$$R \cdot C > n-d \quad (3)$$

Therefore, if the process formed by the following four steps is repeated finitely, it is possible to find out a reception system R that satisfies the formula (3), and to make decoding correctly:

Step 1: In a reception system R, symbols are erased by j symbols (the initial value being 0) in order of those having smaller analogue weights, and a test system R' is generated, where the hard decisions are made on the symbols other than those erased.

Step 2: The code word C' whereby the hard decision decoding is executed is obtained with respect to the test system R'. If no correction is possible, the process will proceed to Step 4.

Step 3: Whether or not the inner product, R·C', of the reception system R and the code word C' satisfies the inequality (3) is determined. If the inequality is satisfied, the code word C' is output. If not, the process will proceed to the step 4.

Step 4: The process goes to the step 1 after j=j+2. However, if j≧d, it indicates a case where an error is caused to exceed the error correcting capability. Therefore, such error is detected.

In this way, it is possible to correct the maximum errors of d−1 by the application of a GMD decoding, and to implement an error correction having its correcting capability two times that of the hard decision recording. Nevertheless, this Forney's GMD decoding requires the hard decision decoding of maximum (d−1)/two times. Therefore, compared to the hard decision decoding that needs decoding only once, the Forney's takes a longer processing time or needs the provision of a decoder having a larger circuitry. As a result, this decoding has not been put in practice very often eventually.

Under such circumstances, E. R. Berlekamp has proposed a remainder decoding that uses a remainder polynomial formulated by dividing a reception system by a code generating polynomial. E. R. Berlekamp shows in the "Faster bounded distance decoding" presented at San Diego ISIT' 90 (1990) that if this remainder decoding method is applied to a GMD decoding, there is a possibility that the amount of calculation required therefor is reduced significantly.

Furthermore, L. R. Welch and E. R. Berlekamp have proposed the Welch-Berlekamp (WB) algorithm in the specification of "Error correction for algebraic block codes" (U.S. Pat. No. 4,633,470). In accordance with this proposal, it is anticipated that an effective implementation of a GMD decoding is possible by means of WB algorithm performed only once without the repetition of the hard decision decoding of (d−1)/2 times maximum.

However, the GMD decoding method that uses this remainder decoding should adopt the generalized syndrome polynomial S (x) to be defined by the formula (4) given below as its syndrome polynomial. Therefore, as compared to the syndrome polynomial S (x) to be defined by the conventionally known formula (5), there is a disadvantage that the proposed method needs a complicated process in order to obtain its syndrome polynomial.

$$S(x) = \sum_{i=0}^{n-2} R_i \cdot \alpha^{i \cdot b} \cdot \prod_{\substack{j=0 \\ j \neq i}}^{d-2} (x - \alpha^j) \quad (4)$$

$$S(x) = \sum_{j=0}^{d-2} \left( \sum_{i=0}^{n-1} R_i \cdot \alpha^{(b+j) \cdot i} \right) \cdot x^j \quad (5)$$

However, b is an arbitrary integer.

As against this method, Okawara, Iwamura, and Imai have proposed a decoding method whereby to perform a GMD decoding by means of the conventional syndrome polynomial defined by the formula (5) (Okawara, Iwamura, and Imai: "On the subject of GMD decoding by means of the conventional syndrome", the 16th Symposium on Information Theory and Its Application, W22-1, 1993).

However, whereas the calculation of the syndrome polynomial is easier, there is a need for the adoption of an algorithm, which is more complicated than the WB algorithm. Later, Kamiya has proposed an algorithm given below, which uses the conventional syndrome polynomial to be defined by the formula (5), but the amount of its calculation still remains substantially the same as that of the WB algorithm (Kamiya: "On the subject of the composition of a shift register that generates Reed-Solomon codes for a GMD decoding, and a multiple system", Shingaku Technical Report IT93-113, PP. 43–48, 1994/3). Of the conventional GMD recording methods, this Kamiya's GMD decoding is effective because of the smallest amount of calculation required. Now, with reference to FIG. 13, this decoding method will be described.

[GMD Method Proposed by Kamiya]

Figure 13:
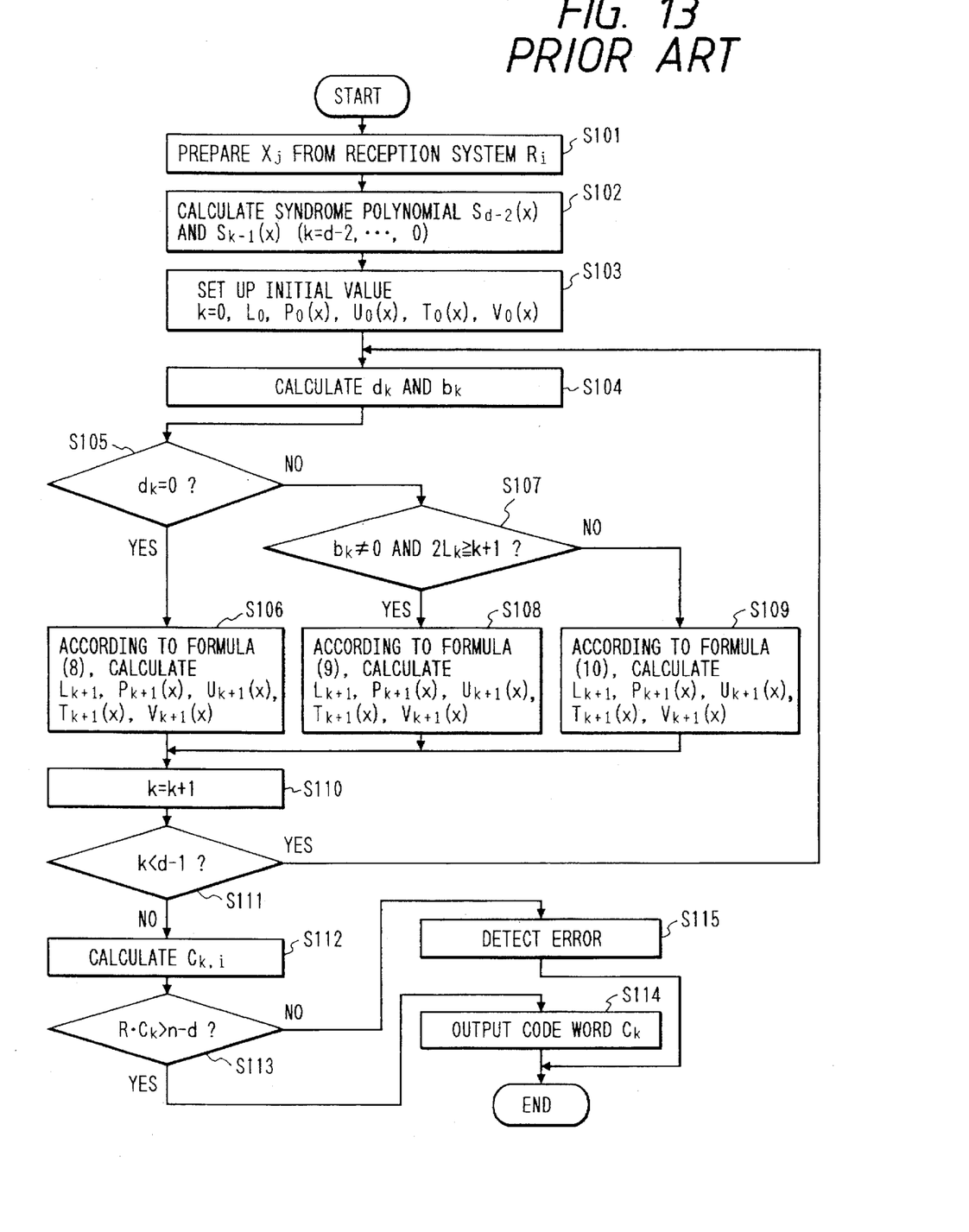
FIG. 13 is a flowchart which shows the decoding procedures in accordance with the prior art.

Step S101: For the reception system $R_i$ (i=0, ..., n-1), the weights $\theta_i$ (i=0, ..., n-1) that indicate reliability are provided, and then, in order of lower reliability, the symbols are positioned at $h_0, \ldots, h_{d-2}$, hence making $X_j = \alpha^{hj}$.

Step S102: The ordinary syndrome polynomial is worked out to get $S_{d-2}$ (x). Further, the next syndrome polynomials $S_{k-1}$ (x) (k=d-2, ..., 0) are calculated and held.

$$S_{d-2}(x) = \sum_{j=0}^{d-2} \left( \sum_{i=0}^{n-1} R_i \cdot (\alpha^{d-2-j})^i \right) \cdot x^j \quad (6)$$

$$S_{k-1}(x) = (x - X_k) \cdot S_k(x) \bmod x^{d-1}$$

Step S103: The initial value is defined:

$k=0, P_0(x)=1, U_0(x)=0, L_0=0, V_0(x)=0,$ $T_0(x)=S_{-1}(x),$ (However, if $L_k=0$, then $b_k=-1$.)

Step S104:

$$d_k = \sum_{j=0}^{L_k} p_{k,j} \cdot S_{k,d-2-j} \quad (7)$$

$$b_k = \sum_{j=0}^{k-L_k} u_{k,j} \cdot S_{k,d-2-j}$$

Steps S105 and S106:

if $(d_k=0)$ then $L_{k+1}=L_k$ $P_{k+1}(x)=P_k(x)$ $U_{k+1}(x)=(x-x_k) \cdot U_k(x)$ $T_{k+1}(x)=T_k(x)/(x-x_k)$ $V_{k+1}(x)=V_k(x)$ \quad (8)

Step S105, and steps S107 to S109:

if $(d_k \neq 0)$ then if $(b_k \neq 0$ and $2 \cdot L_k \geq k+1)$ then $L_{k+1}=L_k$ $P_{k+1}(x)=P_k(x)-(d_k/b_k) \cdot U_k(x)$ $U_{k+1}(x)=(x-x_k) \cdot U_k(x)$ $T_{k+1}(x)=(T_k(x)-(d_k/b_k) \cdot V_k(x))/(x-x_k)$ $V_{k+1}(x)=V_k(x)$ \quad (9)

else $L_{k+1}=L_k+1$ $P_{k+1}(x)=(x-x_k) \cdot P_k(x)$ $U_{k+1}(x)=U_k(x)-(d_k/b_k) \cdot P_k(x)$ $T_{k+1}(x)=T_k(x)$ $V_{k+1}(x)=(V_k(x)-(d_k/b_k) \cdot T_k(x))/(x-x_k)$ \quad (10)

Steps S110 and S111:

$k=k+1$; if $(k<d-1)$ then go to Step S104.

Step S112:

for (k=0 ... d-2) do if $(deg P_k(x) \leq k/2)$ then $N_k(x)=P_k(x) \cdot \lambda_{k-1}(x)$ for (i=0 ... n-1) do if $(N_k(x)(\alpha^i)=0)$ then $c_{k,i}=R_i+T_k(x)(\alpha^i)/(\alpha^{i(d-1)} \cdot N_k'(\alpha^i))$ Steps S113 to S115: Whether or not the inner product $R \cdot C_k$ of the reception system R and the code words $C_k=[c_{k,0}, \ldots, c_{k,n-1}]$ (k=0, ..., d-2) satisfies the inequality (3) is determined. If the inequality is satisfied, the code word $C_k$ is output. If no inequality is satisfied at all, an error that exceeds the error correcting capability occurs. Therefore, the detection of such error is executed. (The end)

However, in the step S102, the $S_{d-2}$ (x) is given as $b \pm j = d-2-j$ in the formula (5). Also, the $P_k$ (x) is an error location polynomial. The $T_k$ (x) corresponds to an error number polynomial. The $U_k$ (x) and the $V_k$ (x) are the auxiliary polynomial thereto. Also, between each of the polynomials, the following relationship is present:

$$T_k(x)=P_k(x) \cdot S_{k-1}(x) \bmod x^{d-1} \quad (11)$$

$$V_k(x)=U_k(x) \cdot S_{k-1}(x) \bmod x^{d-1} \quad (12)$$

Also, the $\lambda_k$ (x) is an erasure location polynomial, which is defined by the following formula:

$$\lambda_k(x) = \prod_{j=k+1}^{d-2} (x-x_j) \quad (13)$$

Also, the $P_{k,j}$, $U_{k,j}$, and $S_{k,j}$ express the jth coefficients of the $P_k$ (x), $U_k$ (x), and $S_k$ (x), respectively.

Nevertheless, the algorithm described above requires d numbers of syndrome polynomials, $S_{d-2}$ (x) to $S_{-1}$ (x), which should be calculated and held in the step S102 in advance for the use of the calculation of the formula (7) in the step S104. Therefore, a problem is encountered that as compared to the other GMD decodings, this decoding needs a greater size of memory.

Figure 10:
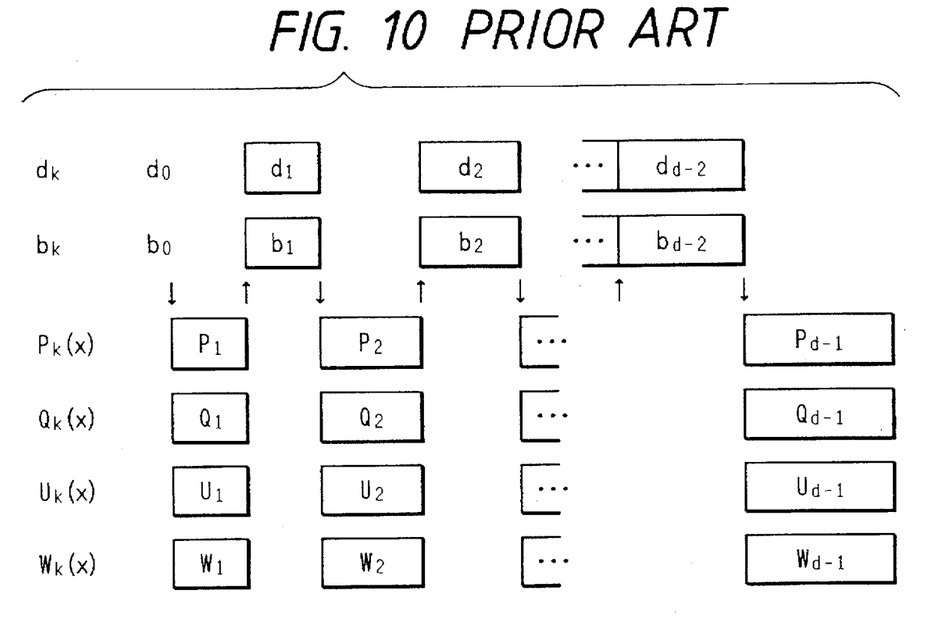
FIG. 10 is a view which shows the calculation order of polynomials for a decoding apparatus in accordance with the prior art.
Figure 11:
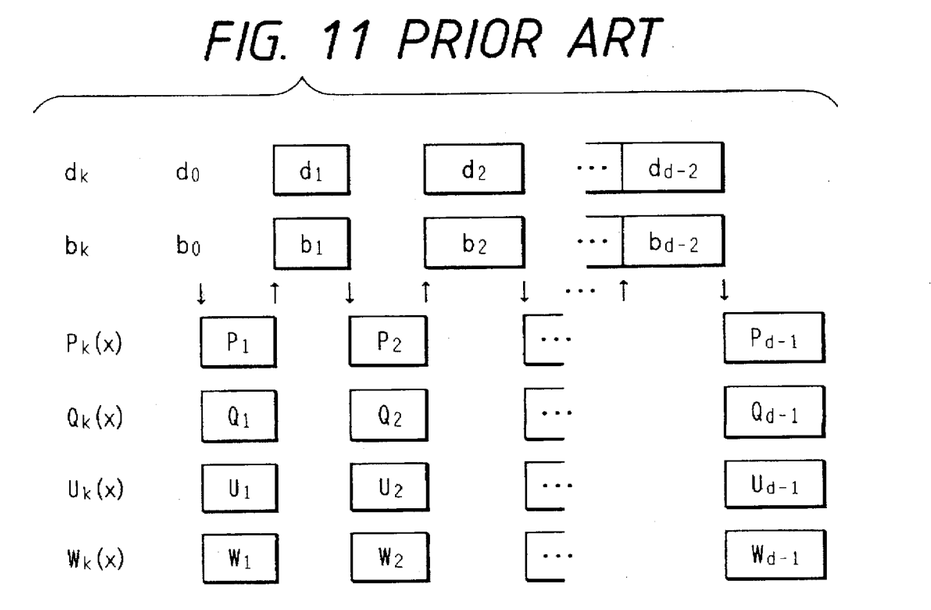
FIG. 11 is a view which shows the calculation order of polynomials for a decoding apparatus in accordance with the prior art.

Also, for the Kamiya's GMD decoding, $d_k$ and $b_k$ are required in order to calculate the $P_{k+1}$ (x), and $U_{k+1}$ (x), and for the calculation of the $d_k$ and $b_k$, it is necessary to prepare all the coefficients, $p_{k,j}$ (j=0, ..., $L_k$) of the $P_k$ (x) and the $U_k$ (x). Therefore, as shown in FIG. 10, the $d_k$ and $b_k$ are the values obtainable only after the calculations of the $P_k$ (x) and $U_k$ (x). As a result, it is only when the calculations of the $P_k$ (x) and $U_k$ (x) are completed that the calculation of the $P_{k+1}$ (x) and $U_{k+1}$ (x) begin. Consequently, even if the calculations of $P_k$ (x) and $U_k$ (x) or $d_k$ and $b_k$ are executed by one clock, for example, there is a need for a clock of approximately 2·(d−1), because these calculations use its result each other. It is impossible to work out the $P_{k+1}$ (x) and $U_{k+1}$ (x) and the $P_k$ (x) and $U_k$ (x) in parallel. The same is applicable to the calculations of $T_{k+1}$ (x) and $V_{k+1}$ (x) and $T_k$ (x) and $V_k$ (x).

SUMMARY OF THE INVENTION

With a view to eliminating the drawbacks described above, the present invention is designed. It is an object of the invention to provide a GMD decoding method and an apparatus thereof using the usual syndrome polynomials without calculating and holding many syndrome polynomials, and capable of calculating them in a smaller amount of calculation than that of the aforesaid Kamiya's decoding method.

Also, it is another object of the invention to provide a GMD decoding method and an apparatus thereof capable of implementing a parallel processing easily, which is difficult for the conventional GMD methods to attain, and of making a high speed decoding by means of such parallel processing.

According to one aspect, the present invention which achieves these objectives relates to a decoding apparatus comprising means for generating a syndrome polynomial to generate syndrome polynomials from a reception system; means for generating an erasure location polynomial to generate erasure location polynomials in accordance with the reliability of each of the symbols of the reception system; polynomial multiplication means for multiplying the syndrome polynomial generated by the means for generating a syndrome polynomial and the erasure location polynomial generated by the means for generating an erasure location polynomial; memory means for storing a plurality of polynomials including the polynomial having the result of multiplication of the polynomial multiplication means as the initial value thereof; calculating means for executing a given number of plural calculations with one or a plurality of polynomials stored in the memory means as input, and outputting a plurality of polynomials as the result of calculations; updating means for updating the polynomials stored in the memory means by use of the output of the calculating means; control means for deciding on the input and output relations of the calculating means in accordance with a coefficient of a given degree of a specific polynomial among the polynomials stored in the memory means; means for generating code words to generate code words one after another by use of the reception system, the polynomials being output one after another by the calculating means, and the erasure location polynomials generated by the means for generating an erasure location polynomial; and determination means for determining whether or not code words generated by the generating means and the reception system satisfy a given condition, and outputting the word found as satisfying the condition as the result of decoding.

According to another aspect, the present invention which achieves these objectives relates to a decoding method comprising the steps of generating a syndrome polynomial to generate syndrome polynomials from a reception system; of generating an erasure location polynomial to generate erasure location polynomials in accordance with the reliability of each of the symbols of the reception system; of multiplying the syndrome polynomial generated in the step of generating a syndrome polynomial and the erasure location polynomial generated in the step of generating an erasure location polynomial; of storing in a memory means a plurality of polynomials including the polynomial having the result of multiplication obtained in the step of polynomial multiplication as the initial value thereof; of making a given number of plural calculations with one or a plurality of polynomials stored in the memory means as input and outputting a plurality of polynomials as the result of calculations; of updating the polynomials stored in the memory means by use of the output of the calculating step; of controlling the decision on the input and output relations of the calculating step in accordance with a coefficient of a given degree of a specific polynomial among the polynomials stored in the memory means; of generating code words one after another by use of the reception system, the polynomials being output one after another in the calculating step, and the erasure location polynomial generated in the step of generating an erasure location polynomial; and of determining whether or not code words generated in the generating step and the reception system satisfy a given condition, and outputting the word found as satisfying the condition as the result of decoding.

Other objectives and advantages besides those discussed above shall be apparent to those skilled in the art from the description of a preferred embodiment of the invention which follows. In the description, reference is made to accompanying drawings, which from a part thereof, and which illustrate an example of the invention. Such example, however, is not exhaustive of the various embodiments of the invention, and therefore, reference is made to the claims which follow the description for determining the scope of the invention.

DETAILED DESCRIPTION OF THE PREFERRED EMBODIMENTS

Hereinafter, with reference to the accompanying drawings, the detailed description will be made of the preferred embodiments in accordance with the present invention.

At first, the theorems utilized for the present embodiment will be described as given below.

Theorem 1:

$$S_k(x) = \sum_{i=0}^{d-2} s_{k,i} \cdot x^i \cdot P_k(x) = \sum_{j=0}^{L_k} p_{k,j} \cdot x^j$$

The multiplicative polynomial of the above formula is defined as $Q_k(x) = S_k(x) \cdot P_k(x) \mod x^{d-1}$. In this case, the coefficient of $x^{d-2}$ for the $Q_k(x)$ is as follows:

$$d_k = \sum_{j=0}^{L_k} s_{k,d-2-j} \cdot p_{k,j}$$

Verification:

$$\begin{aligned}Q_k(x) &= S_k(x) \cdot P_k(x) \mod x^{d-1} \\ &= \left(\sum_{i=0}^{d-2} s_{k,i} \cdot x^i\right)\left(\sum_{j=0}^{L_k} p_{k,j} \cdot x^j\right) \mod x^{d-1} \\ &= \sum_{i=0}^{d-2} \sum_{j=0}^{L_k} s_{k,i} \cdot p_{k,j} \cdot x^{i+j} \mod x^{d-1}\end{aligned}$$

The coefficient $q_{k,d-2}$ of the $x^{d-2}$ for the $Q_k(x)$ is $i+j=d-2$, that is, the following is obtainable from $i=d-2-j$:

$$q_{k,d-2} = \sum_{j=0}^{L_k} s_{k,d-2-j} \cdot p_{k,j}$$

Therefore, $q_{k,d-2} = d_k$
(The end of the verification)
Theorem 2:
If $P_{k+1}(x) = a_0 \cdot P_k(x) - a_1 \cdot U_k(x)$, then the $Q_{k+1}(x) = (a_0 \cdot Q_k(x) - a_1 \cdot W_k(x))/(x-x_{k+1})$
However, it is assumed that $W_k(x) = U_k(x) \cdot S_k \mod x^{d-1}$.
Verification:
From the formula (6), $$S_{k+1}(x) = S_k(x)/(x-x_{k+1})$$

Therefore, $$\begin{aligned}Q_{k+1}(x) &= P_{k+1}(x) \cdot S_{k+1}(x) \mod x^{d-1} \\ &= (a_0 \cdot P_k(x) - a_1 \cdot U_k(x)) \cdot S_k(x)/ \\ &\quad (x - x_{k+1}) \\ &= (a_0 \cdot Q_k(x) - a_1 \cdot W_k(x))/(x - x_{k+1})\end{aligned}$$

(The end of the verification)

From the theorem 1, it is equally clear that the d-2th coefficient for the multiplicative polynomial $W_k(x)$ of the $S_k(x)$ and the $U_k(x)$ is $b_k$. Therefore, the $d_k$ and $b_k$ are the d-2th coefficients of the $Q_k(x)$ and $W_k(x)$.

Also, from the theorem 2, it is anticipated that the calculations of the $Q_{k+1}(x)$ and $W_{k+1}(x)$ are possible by use of the $Q_k(x)$ and $W_k(x)$, together with the calculations of the $P_{k+1}(x)$ and $U_{k+1}(x)$ if it is taken into account that the $(a_0, a_1) = (x-x_k, 0)$, $(a_0, a_1) = (1, d_k/b_k)$.

Also, from the formulas (6) to (8), the following relations are clear:

$$T_k(x) = Q_k(x) \cdot (x - x_k) \qquad (14)$$

$$V_k(x) = W_k(x) \cdot (x - x_k) \qquad (15)$$

Therefore, instead of the $T_k(x)$ and $V_k(x)$, the $Q_k(x)$ and $W_k(x)$ is calculated to obtain the $d_k$ and $b_k$ as the d-2th coefficients of the $Q_k(x)$ and $W_k(x)$. Hence, it becomes unnecessary to make the calculation in the step S104. The $T_k(x)$ and $V_k(x)$ are easily obtainable from the $Q_k(x)$ and $W_k(x)$ by means of the formulas (14) and (15). Each of the coefficients of d numbers of syndrome polynomials, $S_k(x)$ ($k = -1, \ldots, d-2$), is used only for the step S104. Consequently, with the omission of the calculation in the step S104, it will suffice if only one syndrome polynomial is calculated in the step S102 in order to obtain the initial value required for the execution of the step S103. There is no need for calculating and holding any other syndrome polynomials.

Therefore, a GMD decoding can be executed in accordance with the procedures given below.
[Embodiment 1]

At first, the algorithm that brings out the $P_k(x)$ and $Q_k(x)$ from one syndrome polynomial, $S_0(x)$, will be shown as follows:
(However if $L_k = 0$, then $b_k = -1$.)

2) The d-2th coefficients of the $Q_k(x)$ and $W_k(x)$ are defined as $d_k$ and $b_k$.

3) if $(d_k = 0)$ then $$L_{k+1} = L_k$$

$$P_{k+1}(x) = P_k(x)$$

$$U_{k+1}(x) = (x - x_k) \cdot U_k(x)$$

$$Q_{k+1}(x) = Q_k(x)/(x - x_{k+1})$$

$$W_{k+1}(x) = W_k(x) \cdot (x - x_k)/(x - x_{k+1}) \qquad (16)$$

4) if $(d_k \neq 0)$ then if $(b_k \neq 0$ and $2 \cdot L_k \geq k+1)$ then $$L_{k+1} = L_k$$

$$P_{k+1}(x) = P_k(x) - (d_k/b_k) \cdot U_k(x)$$

$$U_{k+1}(x) = (x - x_k) \cdot U_k(x)$$

$$Q_{k+1}(x) = (Q_k(x) - (d_k/b_k) \cdot W_k(x))/(x - x_{k+1})$$

$$W_{k+1}(x) = W_k(x) \cdot (x - x_k)/(x - x_{k+1}) \qquad (17)$$

else $$L_{k+1} = L_k + 1$$

$$P_{k+1}(x) = (x - x_k) \cdot P_k(x)$$

$$U_{k+1}(x) = U_k(x) - (d_k/b_k) \cdot P_k(x)$$

$$Q_{k+1}(x) = Q_k(x) \cdot (x - x_k)/(x - x_{k+1})$$

$$W_{k+1}(x) = (W_k(x) - (d_k/b_k) \cdot Q_k(x))/(x - x_{k+1})$$

5) $k = k+1$; if $(k < d-1)$ then go to 2 $\qquad (18)$ (The end)

Figure 9:
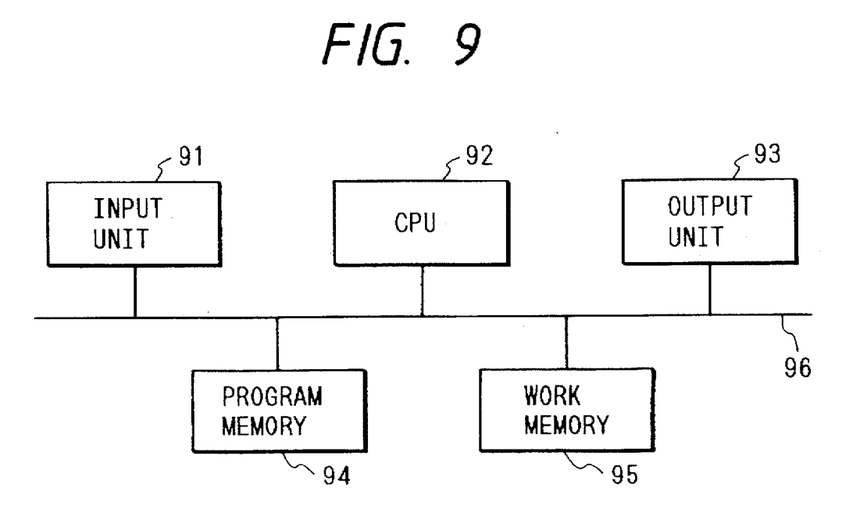
FIG. 9 is a block diagram which shows the structure of an apparatus that executes a decoding method embodying the present invention by means of a software.

It is clear that this algorithm can be implemented in accordance with the software whose structure is shown in FIG. 9.

In FIG. 9, a reference numeral 91 designates an input unit for inputting data on the target processing and defining the initial values of parameters; 92, a CPU for executing programs; 93, an output unit for outputting the results of processes; 94, a program memory for storing various programs including the algorithm described above; 95, a work memory for storing data and others temporarily; and 96, a bus connecting each of the units.

Also, one example of this algorithm implemented by use of hardware is shown below. The following four kinds of calculations are executed for the algorithm described above by the formulas (19) to (22):

$$A_{k+1}(x) = (x - x_k) \cdot A_k(x) \quad (19)$$

$$A_{k+1}(x) = A_k(x) - (d_k/b_k) \cdot B_k(x) \quad (20)$$

$$A_{k+1}(x) = (A_k(x) - (d_k/b_k) \cdot B_k(x))/(x - x_{k+1}) \quad (21)$$

$$A_{k+1}(x) = A_k(x) \cdot (x - x_k)/(x - x_{k+1}) \quad (22)$$

However, the formula, $Q_{k+1}(x) = Q_k(x)/(x - x_{k+1})$, in the third algorithm described above corresponds to the case where $A_k(x) = Q_k(x)$ and $B_k(x) = 0$ in the process of the formula (21).

Figure 1:
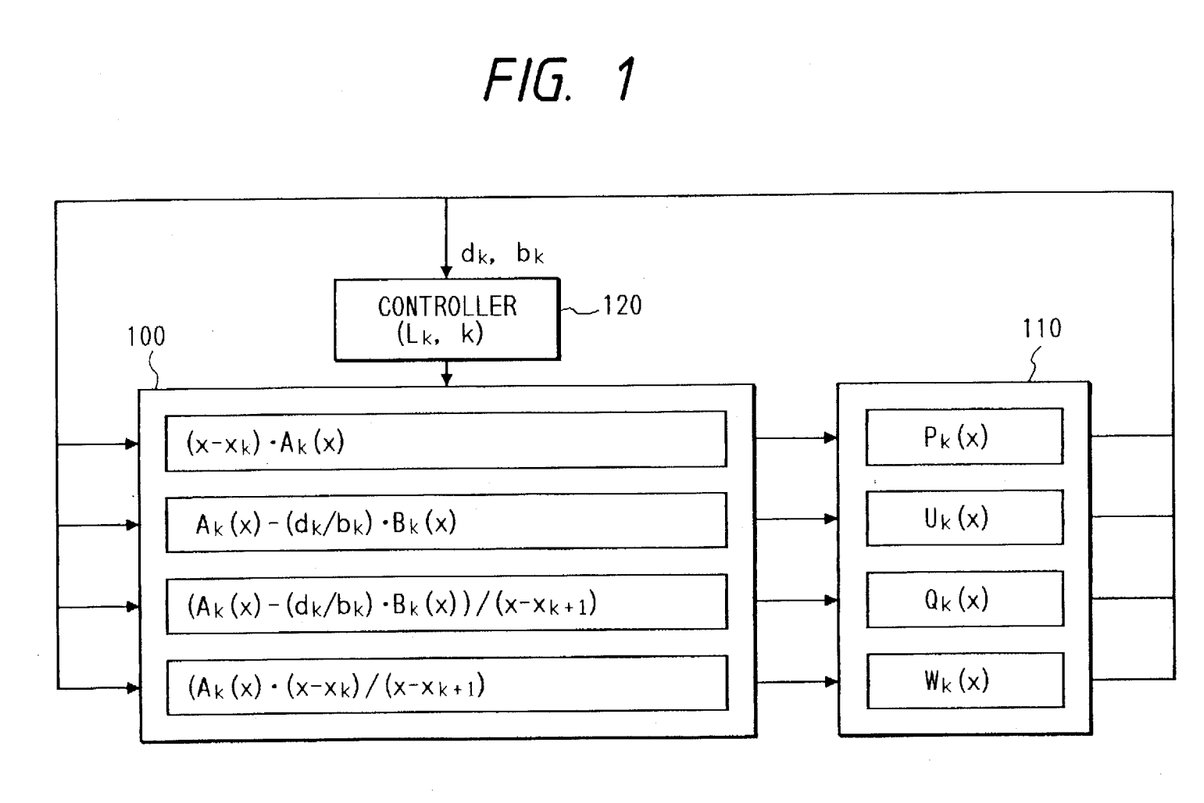
FIG. 1 is a block diagram which shows the structure of a polynomial operation circuit for a decoding apparatus embodying the present invention.

Further, in the algorithm described above, the processes of the formulas (19) to (22) are not overlapped in any one of the cases. Therefore, it is possible to arrange this algorithm by means of an apparatus whose structure is as represented in the block diagram 1. Here, a reference numeral 100 designates an operation unit that executes the calculations of the formulas (19) to (22); 110, a memory unit for storing each of the polynomials temporarily; 120, a controller that fetches $d_k$ and $b_k$ from the memory unit 110, and calculates $L_k$ and k to make a decision to prepare an output from the memory unit 110, thus making it an input of the operation unit 100 for arranging a distribution in accordance with the "if statement" in the aforesaid algorithm. However, even when the $B_k(x) = 0$ as described above, this controller 120 distributes it to the operation unit 100 as an input. Here, each of the polynomials and the initial values represented in the algorithm 1) may be provided for the controller 120 in advance, stored in the memory unit 110, kept in the initial state for the operation unit 100, or provided from the outside source.

Figure 2:
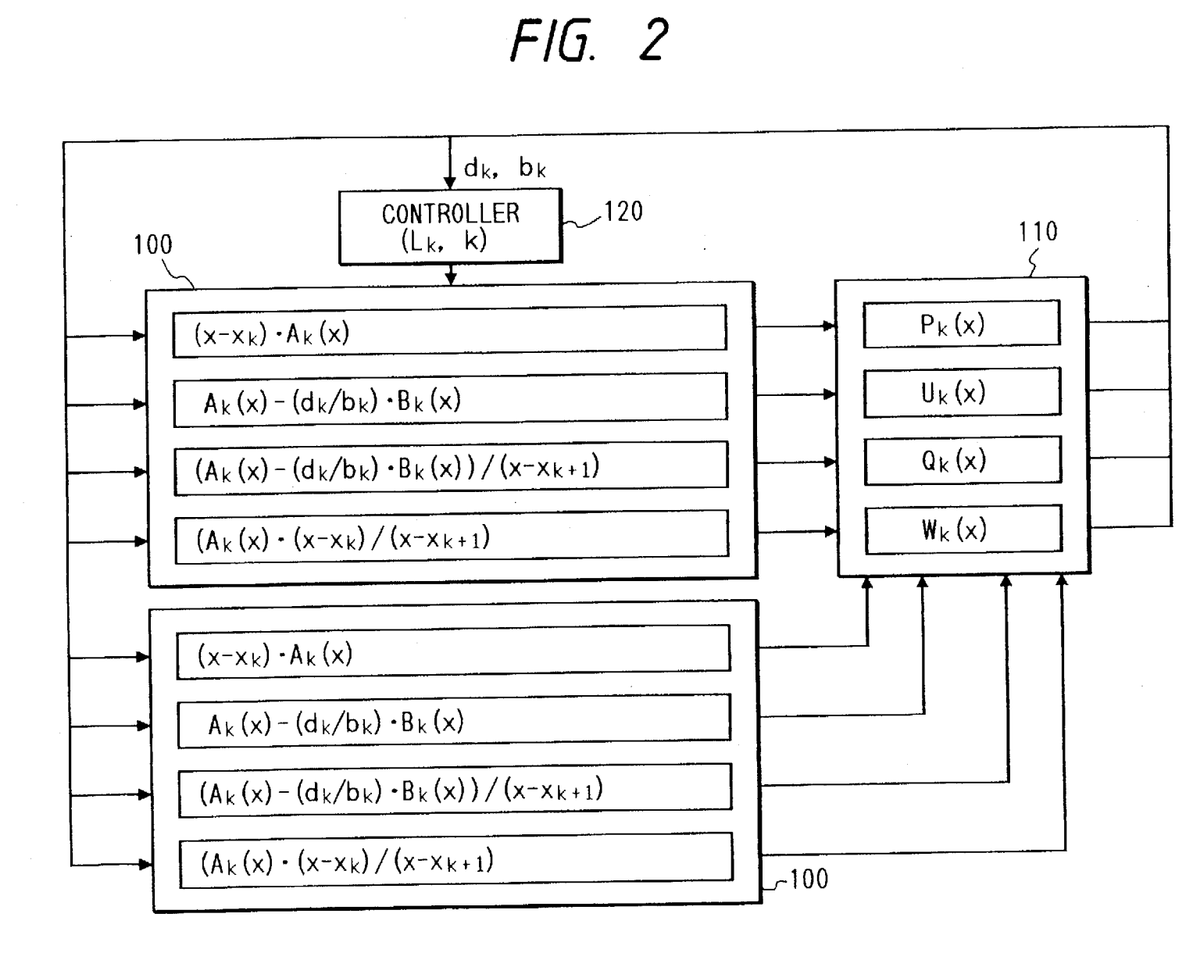
FIG. 2 is a block diagram which shows the structure of another polynomial operation circuit embodying the present invention.

Also, as described later, the algorithm described above can be processed in parallel. Therefore, as shown in FIG. 2, the operation unit is not necessarily limited to only one. It may be possible to arrange a plurality of the same operation units 100.

The operation of the circuit shown in FIG. 1 can be performed as given below, for example. The initial value of each of the polynomials is stored in the memory unit 110 in advance. Then, it is assumed that 0 is given to the controller 120 as the initial values of k and $L_k$. At first, the memory unit 110 outputs each of the polynomials. Then, the controller 120 fetches the d–2nd coefficients $d_k$ and $b_k$ of the output values, $Q_k(x)$ and $W_k(x)$, of the memory unit, and make decisions. For example, if $d_k \neq 0$ and $b_k \neq 0$, while $2 \cdot L_k \geq k+1$, then the controller controls the output $P_k(x)$ from the memory unit so as to be inputted into means for processing the formula (20); $U_k(x)$ into the formula (20) and formula (19); $Q_k(x)$ into the formula (21); and $W_k(x)$ into the formula (22), respectively. As soon as each of the processes thus distributed is completed, the operation unit 100 outputs each result to the memory unit 110. The memory unit 110 again outputs each of the polynomials immediately when the preceding processes are completed in the operation unit 100.

At this juncture, the controller 120 increments the k. (In this case, however, the $L_{k+1} = L_k$. Therefore, the controller 120 does not increment the $L_k$. If the $L_{k+1} = L_k + 1$, then the controller increments $L_k$ to make it $L_{k+1}$.) Thereafter, the same processes are repeated until k=d−1.

Also, in FIG. 2, as soon as the coefficients corresponding to the $d_k$ and $b_k$ of the $Q_k(x)$ and $W_k(x)$ are calculated by and output from one of the operation units 100, for example, the controller 120 uses the other empty operation unit 100 to operate the calculations of the $Q_{k+1}(x)$, $W_{k+1}(x)$, and $U_{k+1}(x)$, and repeats such operations, while incrementing k (and $L_k$ if required). This arrangement is to materialize the operation shown in FIG. 5, which will be described later.

For the arrangement described above, it is assumed that the operation units 100 make calculations by use of the direct formulas (19) to (22) in order to make the description simpler. However, the arrangement is not necessarily limited to this example. It will suffice if only operation units 100 should be able to apply the formulas (19) to (22) to its calculation ultimately. Also, it is arranged to enable the memory unit 110 to input and output each of the polynomials at the same time, but it may be possible to arrange so that the input and output are made in order per polynomial. In this case, the operation unit 100 may be structured with a general-purpose unit capable of executing calculations by one processing unit by the application of the formulas (19) to (22).

Figure 12:
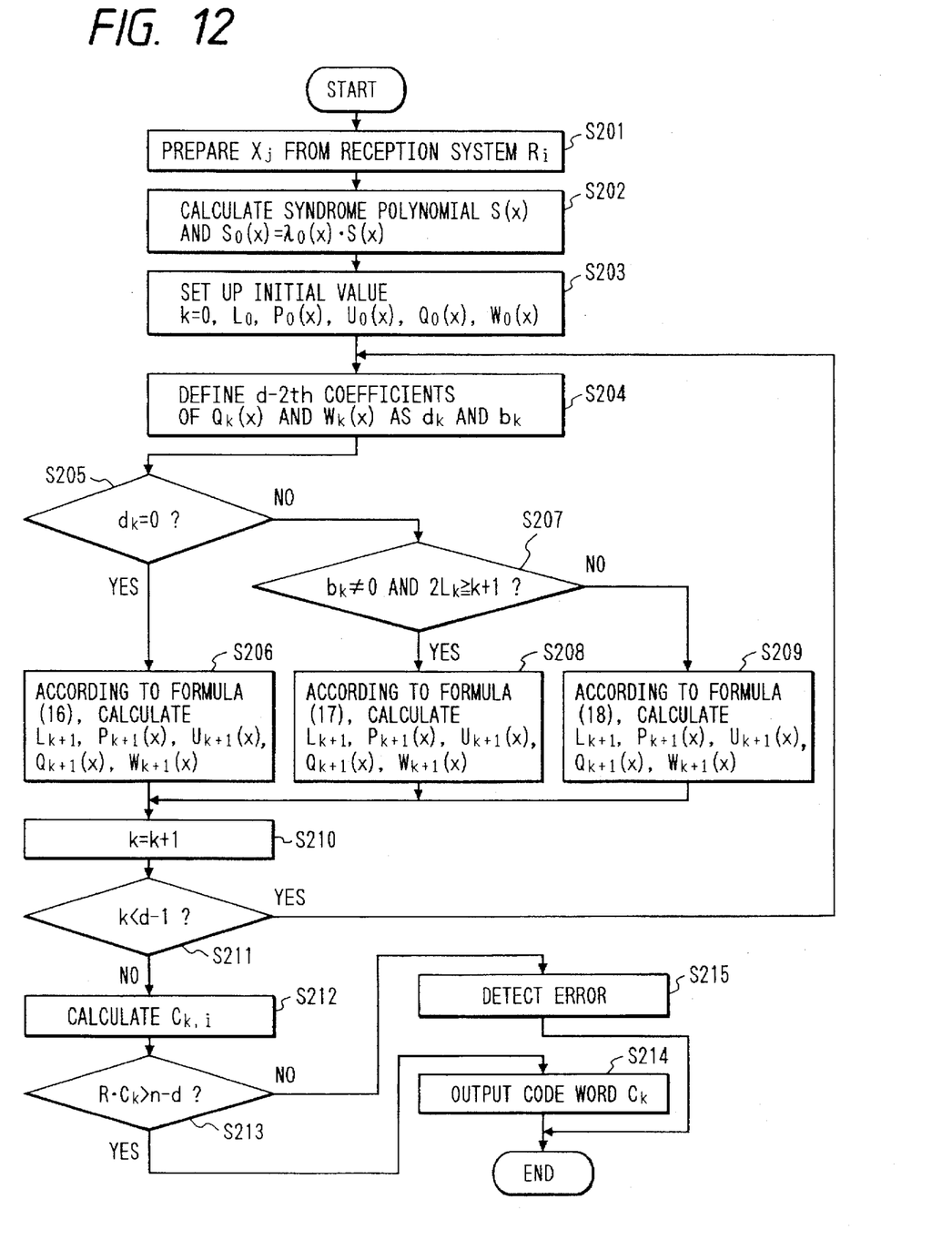
FIG. 12 is a flowchart which shows the decoding procedures embodying the present invention.

Now with reference to a flowchart shown in FIG. 12, the description will be made of a new decoding method that performs a GMD decoding for each reception system $R_i$ (i=0, ..., n−1) by the utilization of the algorithm described above.

Step S201: With respect to the reception system $R_i$ (i=0, ..., n−1), the weights $\theta_i$ (i=0, ..., n−1) that indicate reliability are given. In order of lower reliability, symbols are positioned at $h_0, ..., h_{d-2}$, and then, it is arranged that $x_k = \alpha^{h_k}$.

Step S202: The following syndrome polynomial, S (x) is calculated, and then, it is made $S_0(x)$ by the multiplication of $\lambda_0(x)$:

$$S(x) = \sum_{j=0}^{d-2} \left( \sum_{i=0}^{n-1} R_i \cdot (\alpha^{d-2-j})^i \right) \cdot x$$

$$S_0(x) = \lambda_0(x) \cdot S(x)$$

Step S203:

k=0, $P_0(x) = 1$, $U_0(x) = 0$, $L_0 = 0$, $W_0(x) = 0$, $Q_0(x) = S_0(x)$, (However, if $L_k = 0$, then $b_k = -1$.)

Step S204:

It is assumed that the d−2th coefficients of $Q_k(x)$ and $W_k(x)$ are $d_k$ and $b_k$.

Steps S205 to S206:

if ($d_k = 0$) then $L_{k+1} = L_k$ $P_{k+1}(x) = P_k(x)$ $U_{k+1}(x) = (x - x_k) \cdot U_k(x)$ $Q_{k+1}(x) = Q_k(x)/(x - x_{k+1})$ $W_{k+1}(x) = W_k(x) \cdot (x - x_k)/(x - x_{k+1}) \quad (16)$ Steps S207 to S209:

if $(d_k \neq 0)$ then if $(b_k \neq 0$ and $2 \cdot L_k \geq k+1)$ then $L_{k+1} = L_k$ $P_{k+1}(x) = P_k(x) - (d_k/b_k) \cdot U_k(x)$ $U_{k+1}(x) = (x - x_k) \cdot U_k(x)$ $Q_{k+1}(x) = (Q_k(x) - (d_k/b_k) \cdot W_k(x))/(x - x_{k+1})$ $W_{k+1}(x) = W_k(x) \cdot (x - x_k)/(x - x_{k+1})$     (17)

else $L_{k+1} = L_k + 1$ $P_{k+1}(x) = (x - x_k) \cdot P_k(x)$ $U_{k+1}(x) = U_k(x) - (d_k/b_k) \cdot P_k(x)$ $Q_{k+1}(x) = Q_k(x) \cdot (x - x_k)/(x - x_{k+1})$ $W_{k+1}(x) = (W_k(x) - (d_k/b_k) \cdot Q_k(x))/(x - x_{k+1})$     (18)

Steps S210 and S211:

$k = k+1$; if $(k < d-1)$ then go to Step S204

Step S212:

for $(k=0 \ldots d-2)$ do if $(\deg P_k(x) \leq k/2)$ then $N_k(x) = P_k(x) \cdot \lambda_{k-1}(x)$ for $(i=0 \ldots n-1)$ do if $(N_k(x)(\alpha^i) = 0)$ then $c_{k,i} = R_i + (\alpha^i - \alpha^{hk}) \cdot Q_k(x) \, (\alpha^i)/(\alpha^{i(d-1)} \cdot N_k'(\alpha^i))$ Steps S213 to S215: Whether or not the inner product $R \cdot C_k$ of the reception system R and the code words $C_k = [c_{k,0}, \ldots, c_{k,n-1}]$ $(k=0, \ldots, d-2)$ satisfies the inequality (3). If the inequality is satisfied, the code word $C_k$ is output. If all the inequalities are not satisfied, an error that exceeds the error correcting capability has taken place. Thus, such error is detected.

(The end)

As compared with the Kamiya's decoding method, this decoding can omit the calculation 2) of the step 3. As a result, there is no need for the storage of each of the syndrome polynomials. The size of memory can be smaller. Further, as its calculation can be omitted, it is clear that the amount of calculations is also smaller.

It is also clear that this decoding method can be implemented by use of software.

Figure 3:
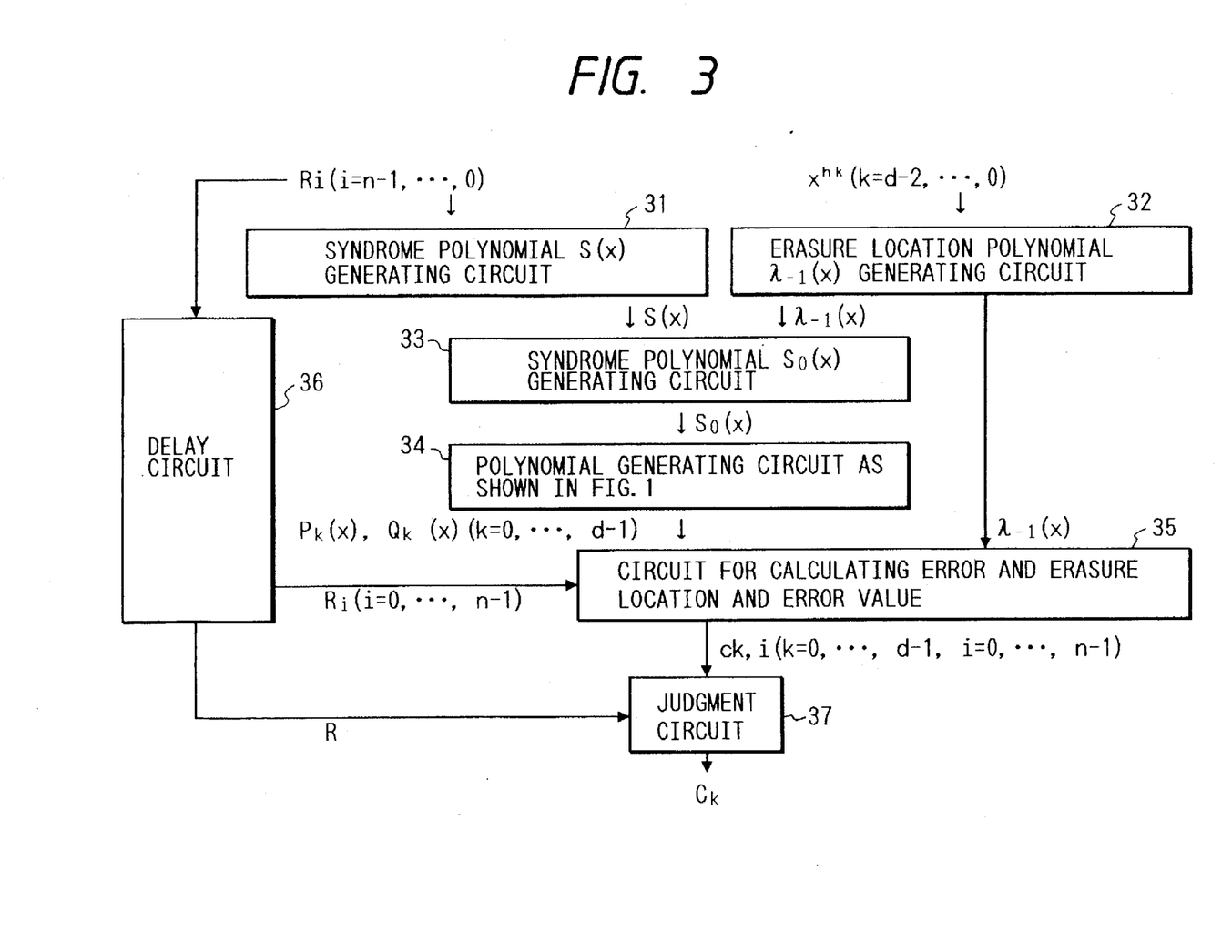
FIG. 3 is a block diagram which shows a circuit structure of a decoding apparatus embodying the present invention.

Meanwhile, one example is given below, in which a decoding apparatus capable of implementing this decoding by means of circuitry is described. Here, it is assumed that the reception system $R_i$ $(i=0, \ldots, n-1)$ and the $x^k$ $(k=0, \ldots, d-2)$ corresponding to its reliability are provided in the step 1 of the decoding method described above before the execution of this decoding. Further, in step 2, the circuit 31 for generating the syndrome polynomial S (x), the circuit 32 for generating the error location polynomial $\lambda_0$ (x), and the circuit 33 for generating the syndrome polynomial $S_0$ (x) arranged by multiplying these polynomials are the circuits for executing the processes by means of the usual erasure correction. Therefore, it is possible to form these circuits with the known structures. Also, in the step S212, the circuit 35 for obtaining the error and erasure locations and error values is of the same structure of the usual error and erasure locations. Therefore, it is also possible to arrange this circuit with the known structure. (However, although the portion where the $c_{k,i}$ are obtained is slightly different from the Kamiya's GMD decoding due to the formula (14), it is possible to make this formation by means of a simple multiplication of a scalar quantity.) Also, the determining circuit 37 in the step S213 is the same as in the conventional GMD decoding. Then, the processes in the steps S203 to S211 can be executed by the circuit 34 for generating the polynomials shown in FIG. 1. As a result, this decoding method is structured by means of the circuit as shown in the block diagram in FIG. 3. However, the delay circuit 36 shown in FIG. 3 is used for causing the reception system to be delayed temporarily for making corrections. This delay circuit can be formed by known structure comprising a RAM or the like, which is performed by FIFO or address controlling.

[Embodiment 2]

The S (x) includes any one of the cases defined by the formula (5). Therefore, the present invention is not limited to the examples shown in the Embodiment 1 and Embodiment 2. For example, if $b \pm j = j$ in the formula (5), the syndrome polynomial is expressed as given below.

$$S(x) = \sum_{j=0}^{d-2} \left( \sum_{i=0}^{n-1} R_i \cdot \alpha^{j+1} \right) \cdot x^j \quad (23)$$

Also, there is a case where the $\lambda_k$ (x) of the formula (13) is defined as given below.

$$\lambda_k(x) = \prod_{j=k+1}^{d-2} (1 - x_j \cdot x) \quad (24)$$

In this case, the $S_k$ $(x) = S(x) \cdot \lambda_k$ (x) can be expressed as given below by use of the coefficient $S_{k,j}$ of the $S_k$ (x) shown in the Embodiment 1.

$$S_k(X) = \sum_{i=0}^{d-2} s_{k,d-2-i} \cdot x^{d-2-k+1} \quad (25)$$

Also, the $P_k$ (x) can be defined as given below.

$$P_k(x) = \sum_{j=0}^{L_k} p_{k,j} \cdot x^{L_k-j} \quad (26)$$

Therefore, the dk becomes the $d-2-k+L_k$th coefficient of the $Q_k$ (x) by means of $Q_k (x) = S_k (x) \cdot P_k (x) \bmod x^{d-1} = \Sigma \Sigma p_k$, $j \cdot s_{k,d-2-i} \cdot x^{d-2-k+1+L_k-j}$. This does not mean that the $d_k$ is limited to the d-2th coefficient of the $Q_k$ (x) if the definitions of the $S_k$ (x) and $P_k$ (x) change in the theorem 1, but it means that the $d_k$ becomes a certain coefficient of a given degree of the multiplicative polynomial $Q_k$ (x) of the $S_k$ (x) and $P_k$ (x). To the $b_k$, the same is applicable. Therefore, the present invention includes all the cases where each of the polynomials is worked out by certain coefficients of the $Q_k$ (x) and $W_k$ (x), which become the $Q_k (x) = S_k (x) \cdot P_k (x) \bmod x^{d-1}$ and $W_k (x) = S_k (x) \cdot U_k (x) \bmod x^{d-1}$, irrespective of the definitions of the $S_k$ (x) and $P_k$ (x). Here,however, the theorem 2 does not change.

Now, the algorithm of the GMD decoding, which is defined by the formulas (23) to (26), will be described.

Step S301: With respect to the reception system $R_i$ $(i=0, \ldots, n-1)$, the weights $\theta_i$ $(i=0, \ldots, n-1)$ that indicate reliability are given, and in order of lower reliability, each of the symbols is positioned at $h_0 \ldots, h_{d-2}$ to make $x_k = \alpha^{hk}$.

Step S302: The syndrome polynomial given below is worked out, and further, multiplied by $\lambda_0$ (x).

$$S(x) = \sum_{j=0}^{d-2} \left( \sum_{i=0}^{n-1} R_i \cdot (\alpha^j)^i \right) \cdot x^j$$

$$S_0(x) = \lambda_0(x) \cdot S(x)$$

Step S303:
$k=0$, $P_0(x)=1$, $U_0(x)=0$, $L_0=0$, $W_0(x)=0$, $Q_0(x)=S_0(X)$,
(However, if $L_k 0$, the $b_k=-1$.)

Step S304:
The $d-2-k+L_k$th coefficients of the $Q_k(x)$ and $W_k(x)$ are defined as $d_k$ and $b_k$.

Steps S305 and S306:

if $(d_k=0)$ then $L_{k+1}=L_k$ $P_{k+1}(x)=P_k(x)$ $U_{k+1}(x)=(x-x_k)\cdot U_k(x)$ $Q_{k+1}(x)=Q_k(x)/(x-x_{k+1})$ $W_{k+1}(x)=W_k(x)\cdot(x-x_k)/(x-x_{k+1})$ Steps S307 to S309:

if $(d_k \neq 0)$ then if $(b_k \neq 0$ and $2\cdot L_k \geq k+1)$ then $L_{k+1}=L_k$ $P_{k+1}(x)=P_k(x)-(d_k/b_k)\cdot U_k(x)$ $U_{k+1}(x)=(x-x_k)\cdot U_k(x)$ $Q_{k+1}(x)=(Q_k(x)-(d_k/b_k)\cdot W_k(x))/(x-x_{k+1})$ $W_{k+1}(x)=W_k(x)$ else $L_{k+1}=L_k+1$ $P_{k+1}(x)=(x-x_k)\cdot P_k(x)$ $U_{k+1}(x)=U_k(x)-(d_k/b_k)\cdot P_k(x)$ $Q_{k+1}(x)=Q_k(x)\cdot(x-x_k)/(x-x_{k+1})$ $W_{k+1}(x)=(W_k(x)-(d_k/b_k)\cdot Q_k(x))/(x-x_{k+1})$ Steps S310 and S311:

$k=k+1$; if $(k<d-1)$ then go to Step S304.

Step S312:

for $(k=0, \ldots, d-2)$ do if $(deg P_k(x) \leq k/2)$ then $N_k(x)=P_k(x)\cdot\lambda_{k-1}(x)$ for $(i=0 \ldots n-1)$ do if $(N_k(x)(\alpha^{-i})=0)$ then $c_{k,i}=R_i+(1-\alpha^{hk-i})\cdot Q_k(x)(\alpha^{-i})/N_k'(\alpha^{-i})$ Steps S313 to S315: Whether or not the inner product $R \cdot C_k$ of the reception system R and the code words $C_k=[c_{k,0}, \ldots, c_{k,n-1}]$ ($k=0, \ldots, d-2$) satisfies the inequality (3) is determined. If the inequality is satisfied, the code word $C_k$ is output. If no inequality is satisfied at all, an error that exceeds the error correcting capability has taken place. Therefore, the detection of such error is executed.
(The end)

As compared with the Kamiya's decoding method, this decoding can omit the calculation in the step S104. As a result, there is no need for the storage of each of the syndrome polynomials. The size of the memory can be smaller. Further, the calculation thereof can be omitted in order to make the calculation in the step S112 simple in the step S312. The amount of calculations can be reduced still more.

This decoding differs from the decoding method shown in the Embodiment 1 in the syndrome calculation in the step S302, in the coefficient selection in the step S304, and in the calculation of the $c_{k,i}$ in the step S312. However, since this syndrome polynomial is included in the usual syndrome polynomial (and erasure location polynomial), this decoding can be implemented by the known means as in the step S312. Also, the coefficient selection in the step S304 is made just by changing the controlled coefficient fetching of the controller. Therefore, it is clear that even if the definitions of the polynomials are changed, this decoding can be implemented as in the Embodiment 1 by means of the circuitry structured as in FIG. 2 or 9 under the procedures arranged substantially the same as those shown in FIG. 12.

Also, the GMD decoding method described above makes it easier to execute a parallel processing as given below.

Figure 5:
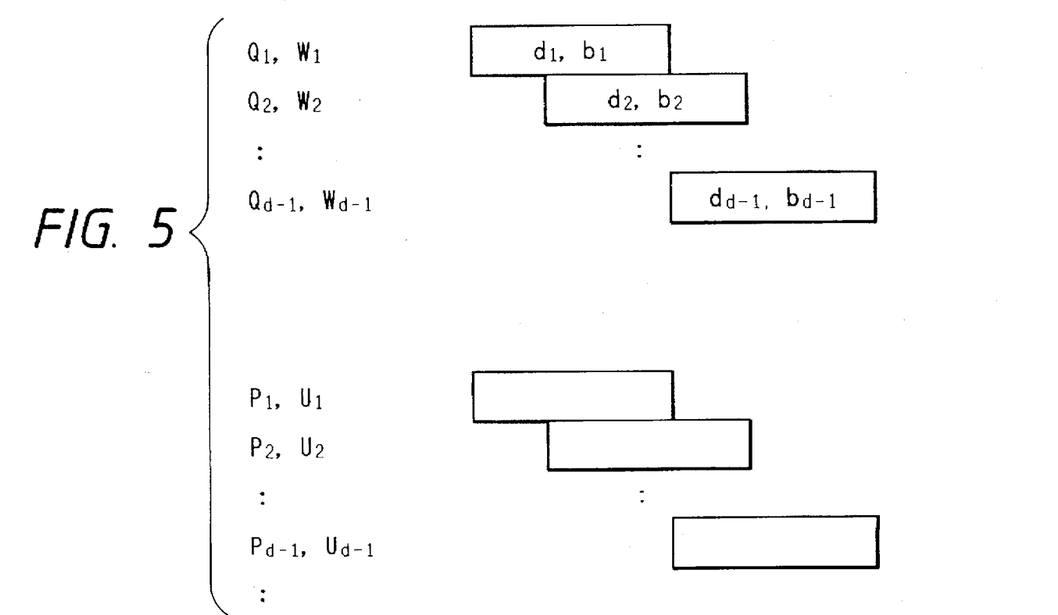
FIG. 5 is a view which shows the calculation order of polynomials for a decoding apparatus embodying the present invention.
Figure 6:
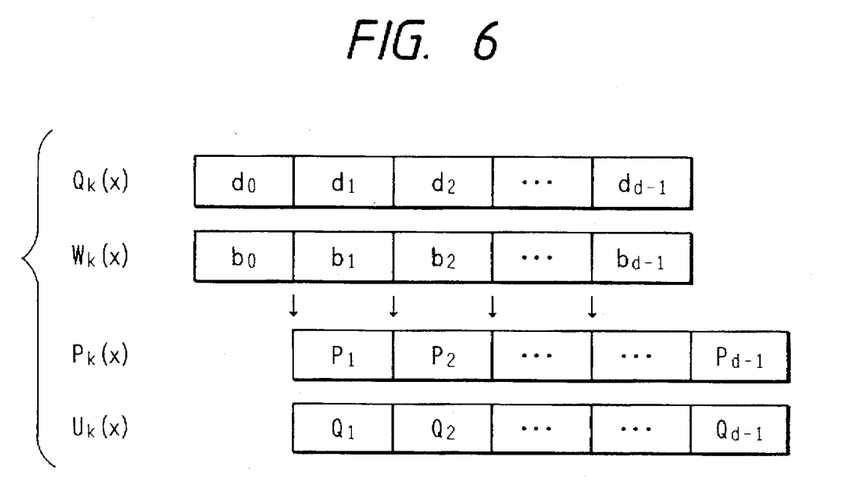
FIG. 6 is a view which shows the calculation order of polynomials for a decoding apparatus embodying the present invention.

For example, in FIG. 2, the $d_k$ and $b_k$ are the coefficients of a certain degree of the $Q_k(x)$ and $W_k(x)$. Therefore, as shown in FIG. 5, for example, if the $Q_k(x)$ and $W_k(x)$ are worked out one after another, it becomes possible to calculate the $Q_{k+1}(x)$ and $W_{k+1}(x)$ in parallel with the $Q_k(x)$ and $W_k(x)$ when the coefficients of the $d_k$ and $b_k$ are calculated for the $Q_k(x)$ and $W_k(x)$. Also, when the calculations of the $Q_k(x)$ and $W_k(x)$ are made by one clock, it should be good enough to apply a clock of approximately $d-1$ as shown in FIG. 6. Therefore, it is possible to make its speed faster than the Kamiya's GMD decoding at least two times. Here, clearly, the parallel processing is also possible likewise as to the $P_k(x)$ and $U_k(x)$.

[Embodiment 3]

Figure 4:
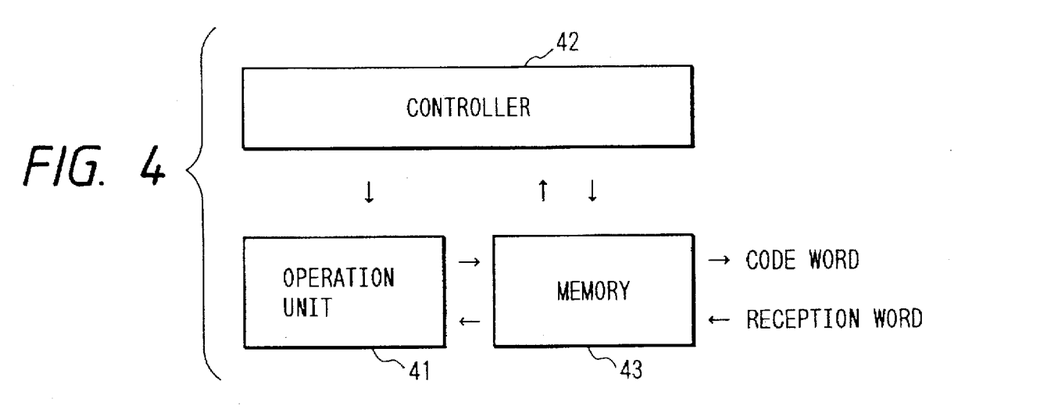
FIG. 4 is a block diagram which shows another circuit structure of a decoding apparatus embodying the present invention.

It is clear that the decoder for use of the decoding methods represented in the Embodiments 1 and 2 is generally materialized by a structure as shown in FIG. 4. The decoder comprises an operation unit 41 in which four operations are combined, a controller 42 for making decisions and controlling the procedures, and a memory 43 including a provisional storage.

[Embodiment 4]

Figure 7:
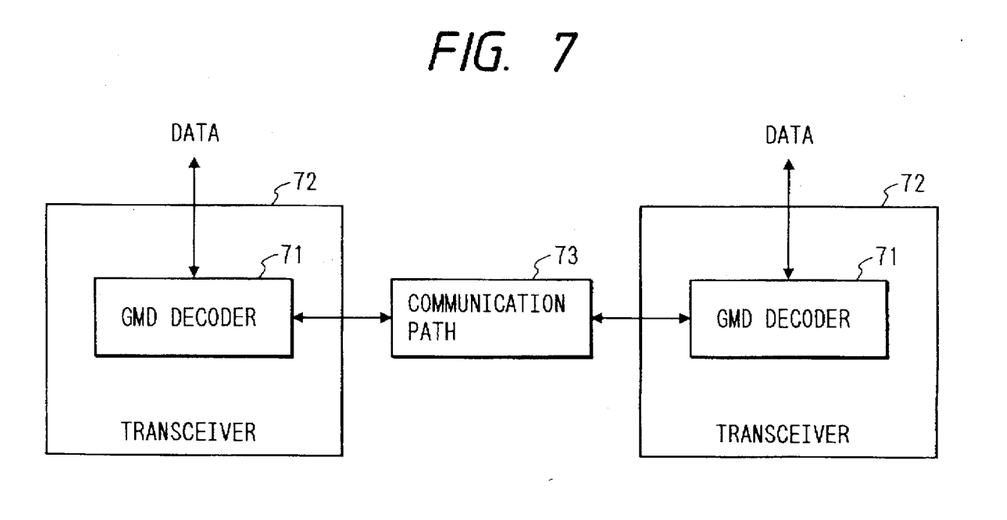
FIG. 7 is a block diagram which shows the structure of a digital communication system.

The GMD decoders shown in the Embodiments 1 to 3 are used for enhancing the reliability of various digital systems. FIG. 7 is a view which shows an embodiment in which each GMD decoder 71 of the Embodiments 1 to 3 is used for a digital communication system. Conceivably, as examples of digital communication systems, satellite communications, SS (Spread Spectrum) communications, LAN (Local Area Network) can be cited, among others. In this case, the communication path shown in FIG. 7 is a space or fibers, among others. The transceiver 72 is each of the communication terminals or computers, among others. Also, in the example shown in FIG. 7, a GMD decoder 71 is included in the transceivers 72 on both parties. However, since it is known that encoding is possible by the decoding processing if only the location of the detected symbol of the error correction codes is replaced with that of the erasure location, the GMD decoder 71 is used as an encoder on the transmission side. Nevertheless, since the structure of an encoder is simple, it may be possible to provide encoders besides the GMD decoders 71 described above or if the transceiver can be specified as a transmitter or receiver, such transceiver maybe provided with an encoder as a transmitter while being provided with a GMD decoder as a receiver, respectively.

[Embodiment 5]

Figure 8:
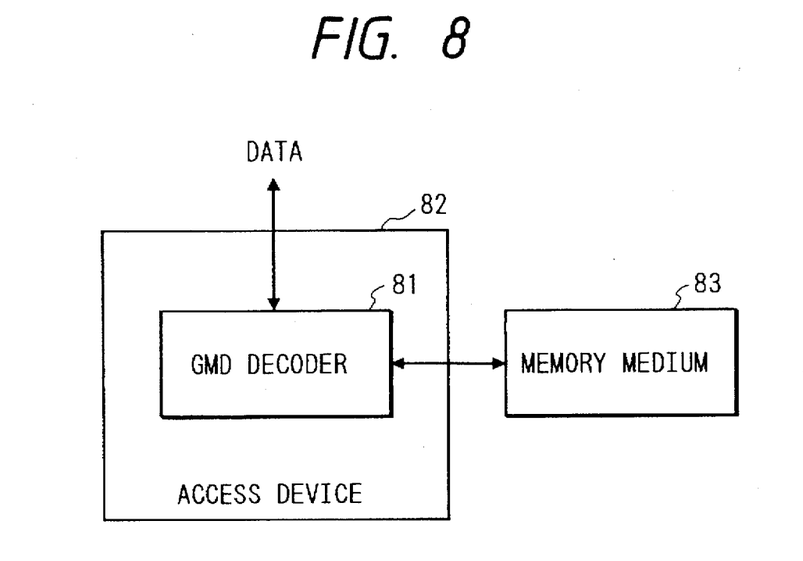
FIG. 8 is a block diagram which shows the structure of a digital memory system.

FIG. 8 is a view which shows a case where the GMD decoder described above is used for a digital memory system. As digital memory systems, there are conceivably optical disk devices and magneto-optic disk devices, among others. Here, an access device 82 is to read data from and write them on a memory medium 83 through the GMD decoder 81.

In accordance with the embodiments described above, the GMD decoders have the following advantages as has been described above:

1) The amount of calculations required for executing the Kamiya's decoding method is the smallest of the conventional GMD decodings. However, the decoding method embodying the present invention finds it unnecessary to work out the $d_k$ and $b_k$. Although the quantity of scalar multiplication is increased in the calculations of the $c_{k,i}$ instead, this multiplication is much simpler than the calculations of the $d_k$ and $b_k$. Therefore, the amount of calculations of the decoding method embodying the present invention is smaller than any one of the conventional GMD decodings.

2) The most serious problem of the Kamiya's GMD decoding is that it should keep many numbers of syndrome polynomials in storage. However, there is no need for such storage.

3) Unlike the Kamiya's GMD decoding, it is possible to execute a parallel processing. Therefore, the decoding can be easily made faster.

4) It is possible to utilize a usual syndrome as the syndrome required therefor.

The present invention described above may be applicable to a system structured by plural computers or to a specific computer within the system. Also, the present invention is applicable to a case where it is attainable when the computer executes a program. The program may be provided from an external memory medium. The memory medium that stores such program is within the scope of the present invention.

Although the present invention has been described in its preferred form with a certain degree of particularity, many apparently widely different embodiments of the invention can be made without departing from the spirit and the scope thereof. It is to be understood that the invention is not limited to the specific embodiments thereof except as defined in the appended claims.

What is claimed is:

1. A decoding apparatus comprising:

means for generating a syndrome polynomial to generate syndrome polynomials from a reception system;

means for generating an erasure location polynomial to generate erasure location polynomials in accordance with reliability of each of the symbols of said reception system;

polynomial multiplication means for multiplying the syndrome polynomial generated by said means for generating a syndrome polynomial and the erasure location polynomial generated by said means for generating an erasure location polynomial;

memory means for storing a plurality of polynomials including said polynomial having the result of multiplication of said polynomial multiplication means as the initial value;

calculating means for executing a given number of plural calculations with one or a plurality of polynomials stored in said memory means as input, and outputting a plurality of polynomials as the result of calculations;

updating means for updating the polynomials stored in said memory means by use of the output of said calculating means;

control means for deciding on the input and output relations of said calculating means in accordance with a coefficient of a given degree of a specific polynomial among the polynomials stored in said memory means;

means for generating code words to generate code words one after another by use of said reception system, said polynomials being output one after another by said calculating means, and the erasure location polynomials generated by said means for generating an erasure location polynomial; and determination means for determining whether or not code words generated by said generating means and said reception system satisfy a given condition, and outputting the word found as satisfying said condition as the result of decoding.

2. A decoding apparatus according to claim 1, wherein said apparatus further comprises a plurality of calculation means for executing a given plurality of calculations, and each of said calculating means calculates the coefficient of each of polynomials to be output in order of degrees thereof, and said control means controls to begin the calculation of the next polynomial to be calculated in order by another calculation means when said coefficient of a given degree of said specific polynomial is calculated by one calculation means.

3. A decoding apparatus according to claim 1, wherein said control means is provided with means for storing variables to store variables, and means for updating variables to update the variables stored in said means for storing variables, and decides on the input and output relations of said calculation means in accordance with the values of said variables in addition to said coefficient of given degree.

4. A decoding apparatus according to claim 1, wherein said updating means updates a part of said variables in accordance with said coefficient of given degree.

5. A decoding method comprising the following steps of:

generating a syndrome polynomial to generate syndrome polynomials from a reception system;

generating an erasure location polynomial to generate erasure location polynomials in accordance with reliability of each of the symbols of said reception system;

multiplying the syndrome polynomial generated in said step of generating a syndrome polynomial and the erasure location polynomial generated in said step of generating an erasure location polynomial;

storing in a memory means a plurality of polynomials including the polynomial having the result of multiplication obtained in said step of polynomial multiplication as the initial value thereof;

making a given number of plural calculations with one or a plurality of polynomials stored in said memory means as input and outputting a plurality of polynomials as the result of calculations;

updating the polynomials stored in said memory means by use of the output of said calculating step;

controlling the decision on the input and output relations of said calculating step in accordance with a coefficient of a given degree of a specific polynomial among the polynomials stored in said memory means;

generating code words one after another by use of said reception system, the polynomials being output one after another in said calculating step, and the erasure location polynomial generated in said step of generating an erasure location polynomial; and determining whether or not code words generated in said generating step and said reception system satisfy a given condition, and outputting the word found as satisfying said condition as the result of decoding.

6. A decoding method according to claim 5, wherein said method further comprises steps of using a plurality of calculation units for executing a given plurality of calculations, and of calculating the coefficient of each of polynomials to be output in order of degrees thereof in each of said calculation units, and of controlling to begin the calculation of the next polynomial to be calculated in order by another calculation unit when said coefficient of a given degree of said specific polynomial is calculated by one calculation unit.

7. A decoding method according to claim 5, wherein said method is further provided with steps of storing variables in a memory for storing variables, and of updating variables to update the variables stored in said memory for storing variables, and in said controlling step, the input and output relations of said calculation step is decided in accordance with the values of said variables in addition to said coefficient of given degree.

8. A decoding method according to claim 5, wherein a part of said variables is updated in said updating step in accordance with said coefficient of given degree.

* * * * *

UNITED STATES PATENT AND TRADEMARK OFFICE
CERTIFICATE OF CORRECTION

PATENT NO. : 5,742,620

DATED : April 21, 1998

INVENTOR(S) : Keiichi Iwamura

It is certified that error appears in the above-identified patent and that said Letters Patent is hereby corrected as shown below:

Column 11, line 49, change "2)" to --2,--.

Column 12, line 27, change Equation (23) to read $$--S(x) = \sum_{j=0}^{d-2} \left( \sum_{i=1}^{n-1} R_i \cdot \alpha^{j \cdot i} \right) \cdot x^j --$$

Column 13, line 10, change "$L_K 0$," to --$L_K=0$,--.

Column 15, line 6, change "maybe" to --may be--.

Signed and Sealed this

Twelfth Day of September, 2000

Attest:

Q. TODD DICKINSON

*Attesting Officer*     *Director of Patents and Trademarks*